United States Patent
Gerding et al.

(10) Patent No.: US 8,143,922 B2
(45) Date of Patent: Mar. 27, 2012

(54) SAMPLING CIRCUIT

(75) Inventors: Michael Gerding, Herne (DE); Burkhard Schiek, Bochum (DE); Thomas Musch, Muelheim an der Ruhr (DE)

(73) Assignee: Krohne S.A., Romans-Cedex (FR)

( * ) Notice: Subject to any disclaimer, the term of this patent is extended or adjusted under 35 U.S.C. 154(b) by 557 days.

(21) Appl. No.: 11/383,009

(22) Filed: May 12, 2006

(65) Prior Publication Data

US 2006/0267821 A1 Nov. 30, 2006

(30) Foreign Application Priority Data

May 25, 2005 (DE) .......................... 10 2005 024 643

(51) Int. Cl.
*H03K 17/00* (2006.01)
(52) U.S. Cl. .......................................... 327/94; 327/91
(58) Field of Classification Search .............. 327/91, 327/94–97
See application file for complete search history.

(56) References Cited

U.S. PATENT DOCUMENTS

| | | | |
|---|---|---|---|
| 4,308,468 A | 12/1981 | Olson | |
| 4,788,511 A * | 11/1988 | Schindler | 330/277 |
| 4,837,530 A * | 6/1989 | Kondoh | 333/81 A |
| 5,170,075 A | 12/1992 | de Wit | |
| 5,309,048 A * | 5/1994 | Khabbaz | 327/310 |
| 5,457,415 A * | 10/1995 | Schlig | 327/94 |
| 5,517,140 A * | 5/1996 | Hatsuda | 327/95 |
| 6,072,360 A * | 6/2000 | McCullough | 327/558 |
| 6,111,606 A * | 8/2000 | Ikeda | 348/241 |
| 6,492,933 B1 * | 12/2002 | McEwan | 342/28 |
| 6,504,406 B1 * | 1/2003 | Kakitani | 327/94 |
| 6,556,063 B2 * | 4/2003 | Wyland | 327/434 |
| 6,649,553 B2 * | 11/2003 | Sugimoto et al. | 501/136 |
| 6,807,281 B1 * | 10/2004 | Sasaki et al. | 381/111 |
| 6,850,098 B2 * | 2/2005 | Lee et al. | 327/94 |
| 6,977,544 B2 * | 12/2005 | Nicollini et al. | 327/589 |
| 7,461,281 B2 * | 12/2008 | Miyazaki | 713/323 |
| 7,532,042 B2 * | 5/2009 | Lee | 327/91 |
| 2004/0239369 A1 * | 12/2004 | Hsu et al. | 326/115 |
| 2007/0103186 A1 * | 5/2007 | Clements et al. | 326/30 |
| 2007/0159182 A1 * | 7/2007 | Bradley | 324/638 |
| 2007/0176674 A1 * | 8/2007 | Shioda | 327/559 |

FOREIGN PATENT DOCUMENTS

| | | |
|---|---|---|
| DE | 42 37 925 A1 | 5/1994 |
| EP | 0 037 258 A2 | 10/1981 |
| JP | 2000-134097 | 5/2000 |

* cited by examiner

*Primary Examiner* — Long Nguyen
(74) *Attorney, Agent, or Firm* — Roberts Mlotkowski Safran & Cole, P.C.; David S. Safran

(57) ABSTRACT

A sampling circuit for sequential sampling of a broadband periodic input signal having a field effect transistor as a nonlinear component to which a pulsed-shaped sampling signal is supplied, by which sampling is activated so that an output signal is produced. In this way, a sampling circuit is attained which is economical, technically durable and which can be used in a versatile and simple manner.

2 Claims, 4 Drawing Sheets

SAMPLING CIRCUIT

BACKGROUND OF THE INVENTION

1. Field of the Invention

The invention relates to a sampling circuit for sequential sampling of a broadband periodic input signal, there being a nonlinear component to which a pulsed-shaped sampling signal is supplied, by which sampling is activated so that an output signal is produced.

2. Description of Related Art

The detection of a broadband signal or a signal characteristic which changes quickly in time can only be done by means of real time sampling with very great technical effort or not at all. A typical application is fill level measurement by means of a pulsed radar, the technical problem lying in measuring the propagation delay of the radar signal very accurately. For distance measurement accuracy of 1 mm, accuracy of time measurement of roughly 6 ps is necessary. One possible alternative for real time sampling is sequential sampling. Sequential sampling manages with a much smaller sampling rate, but is limited solely to use for periodic signals. In contrast to real time sampling, only one sampling value is recorded per signal period. Then, a high speed signal to be sampled is reconstructed from a plurality of individual sampling points. Since this sampling process results in frequency conversion of the input signal, this process can also be interpreted as harmonic mixing.

One conventional implementation of a sampling circuit is shown in FIG. 1. An input signal to be sampled is routed via a transmitting and receiving line to two switching diodes 2, 3 arranged anti-parallel. The two switching diodes 2, 3 arranged anti-parallel are operated in the idle state by a respective DC bias applied first in the reverse direction. During the actual sampling process, a pulse-shaped sampling signal $s_1(t)$ and a sampling signal $s_2(t)$ which is inverse to it conductively switch the switching diodes 2, 3 so that the segment between the feed of the input signal $u_c(t)$ to be sampled and the two sampling capacitors 4, 5 connected downstream of the switching diodes 2, 3 become low-resistance for a short time. The charging portion on the sampling capacitors 4, 5, which originates from the pulse-shaped sampling pulses, can discharge via the resistors 6, 7. Under the assumption that the sampling capacitors 4, 5 are fully discharged between the two sampling processes, the sampling points of the sampled input signal arise fundamentally from the average voltage $u_s(t)$ prevailing over the sampling capacitors 4, 5. If the relationship $s_1(t)=-s_2(t)$ applies between the two sampling signals, the nodes 8, 9 can be regarded as virtual ground points with respect to these signals. Consequently, in the ideal case, the sampling signals on these nodes 8, 9 are mutually cancelled out so that feedthrough of the sampling signals in the intermediate frequency path and the signal path is stopped, by which balancing of the circuit is achieved.

The disadvantages in this conventional approach are, among others, the extreme demands on the phase and amplitude characteristic of the two sampling signals which are inverse to one another, as are necessary for operational balancing. To ensure balancing, the two sampling signals must be identical according to absolute value, and at the same time, must have phases turned exactly 180°; this allows generation of these signals to become accordingly complex and makes the operation of the circuit susceptible to component tolerances.

SUMMARY OF THE INVENTION

In view of the above noted problem, it is a primary object of the present invention to devise such a circuit which is economical, technically durable and which can be used in a versatile and simple manner.

Proceeding from the initially described sampling circuit for sequential sampling of a broadband periodic input signal, this object is achieved by there being a field effect transistor as a nonlinear component.

Therefore, in accordance with the invention, a field effect transistor is used to activate sampling, so that, when a pulse-shaped sampling signal is present, to detect the input signal to be sampled, and thus, to produce the output signal as a sampled signal. Here, it holds that the field effect transistors have inherent decoupling between the gate and drain so that, for suitable connection of the field effect transistor, the sampling signal crosses neither into the signal path nor into the intermediate frequency path. Another advantage of a sampling circuit with a field effect transistor lies in the inherent noise balancing, since the signal at the gate is not rectified.

Altogether therefore, inherent decoupling of the trigger signal and the output signal with inherent noise balancing of the sampling circuit is obtained. The selection of different types of field effect transistors (n-channel/p-channel) yields other degrees of freedom with respect to the polarity of the unipolar sampling pulses and the implementation of different output impedances for the sampled input signal.

Basically, there are various possibilities for feeding of the input signal or of the sampling signal. According to one preferred development of the invention, it is provided that feed of the input signal takes place on the drain contact of the field effect transistor. According to a preferred development of the invention, it is further provided that there is a feed of the sampling signal on the gate contact of the field effect transistor.

According to a preferred development of the invention, there is also decoupling of the output signal on the drain contact of the field effect transistor. Furthermore, it is preferably provided especially that the feed of the input signal is separated from decoupling of the output signal by means of a filter arrangement. Preferably, on the feed side, a high-pass filter is used and/or on the decoupling side a low-pass filter is used. A multistage LC filter with magnetically shielded inductances is especially preferred.

According to another preferred development of the invention, it is provided that decoupling of the output signal on the source contact of the field effect transistor takes place. Preferably, the drain contact of the field effect transistor is DC-decoupled via a capacitance. Moreover, it is preferably provided that the input signal is supplied to the field effect transistor via a transmitting and receiving line into which a Π-attenuation element is inserted. Furthermore, on the decoupling side, there is preferably a filter arrangement, quite especially in the form of a RC filter cascade. Finally, there is preferably another storage capacitor on the decoupling side.

In the preferred development of the invention described last, there can be an additional field effect transistor connected as a "dummy." In this way, a circuit structure is obtained which constitutes an expansion of the above described circuit. More or less, it is two individual circuits of identical structure, with one field effect transistor each, the output signal of the entire circuit being formed from the difference of the intermediate frequency signals of the two individual circuits. While one individual circuit is made and operated as is described above, the field effect transistor of the additional individual circuit is connected as a "dummy". The drain contact of the additional field effect transistor is loaded with an impedance which is preferably identical to the load impedance, by which the other field effect transistor is loaded on the drain contact by the signal path. Furthermore, it can be preferably provided that the two field effect transistors are supplied with the same sampling signal. Moreover, it is preferably provided that the two field effect transistors are triggered with the same gate bias.

In particular, there are now a plurality of possibilities for embodying and developing the sampling circuit of the invention for sequential sampling of a broadband periodic input signal. For this purpose, reference is made to the following detailed description of preferred embodiments of the invention along with the accompanying drawings.

DETAILED DESCRIPTION OF THE INVENTION

The sampling circuits described below, according to preferred exemplary embodiments of the invention, each have GaAs junction gate field effect transistors with Schottky contacts which are passively operated, i.e., without stipulation of a drain-source voltage. In addition to very good, large signal properties, absolute stability of the circuit can be achieved in this way, The actual sampling or frequency conversion of a broadband input signal $u_c(t)$ to a narrowband intermediate frequency signal $u_s(t)$ takes place by modulation of the non-linear, voltage-dependent drain-source channel resistance by means of a pulse-shaped sampling signal s(t).

Figure 1:
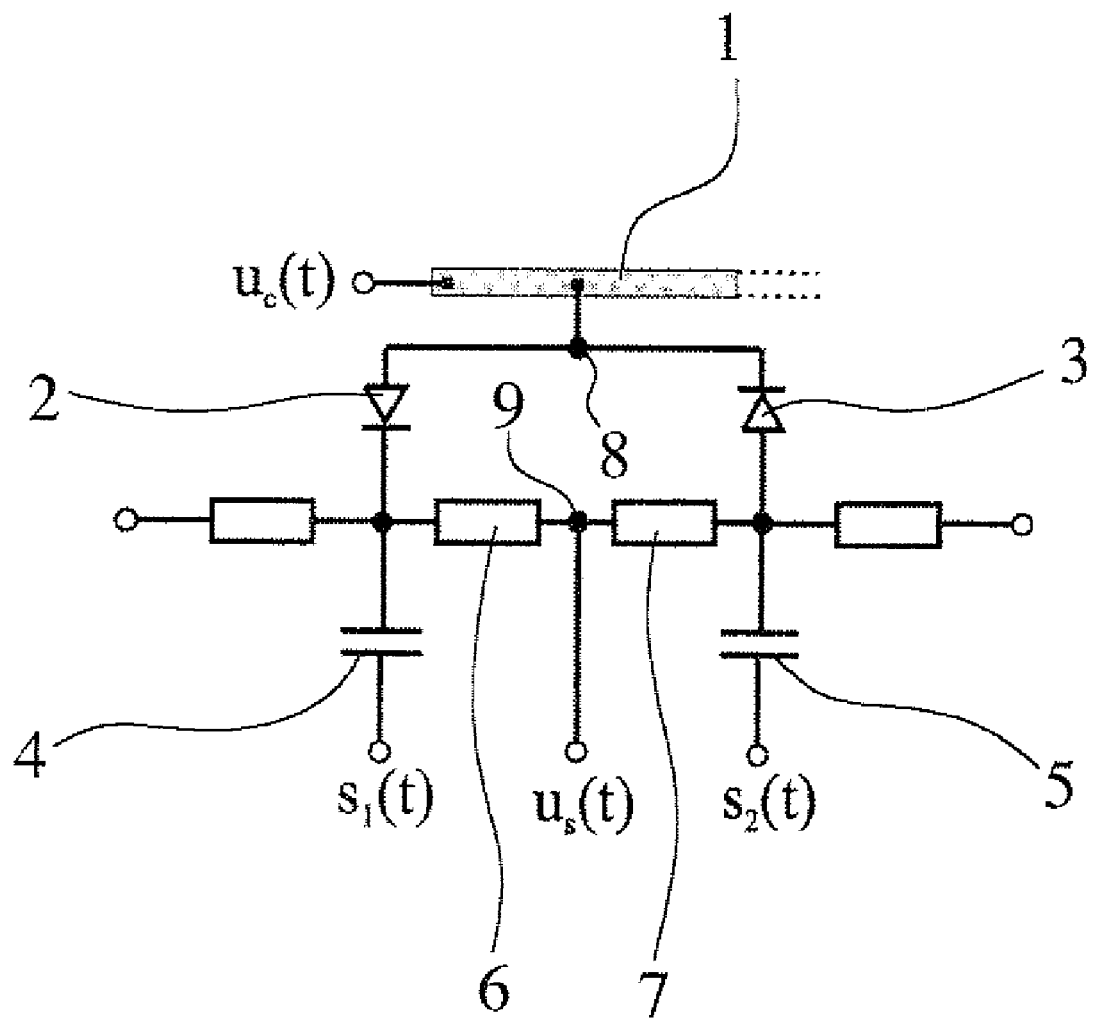
FIG. 1 is a block diagram of a conventional sampling circuit based on diodes connected anti-parallel.
Figure 2:
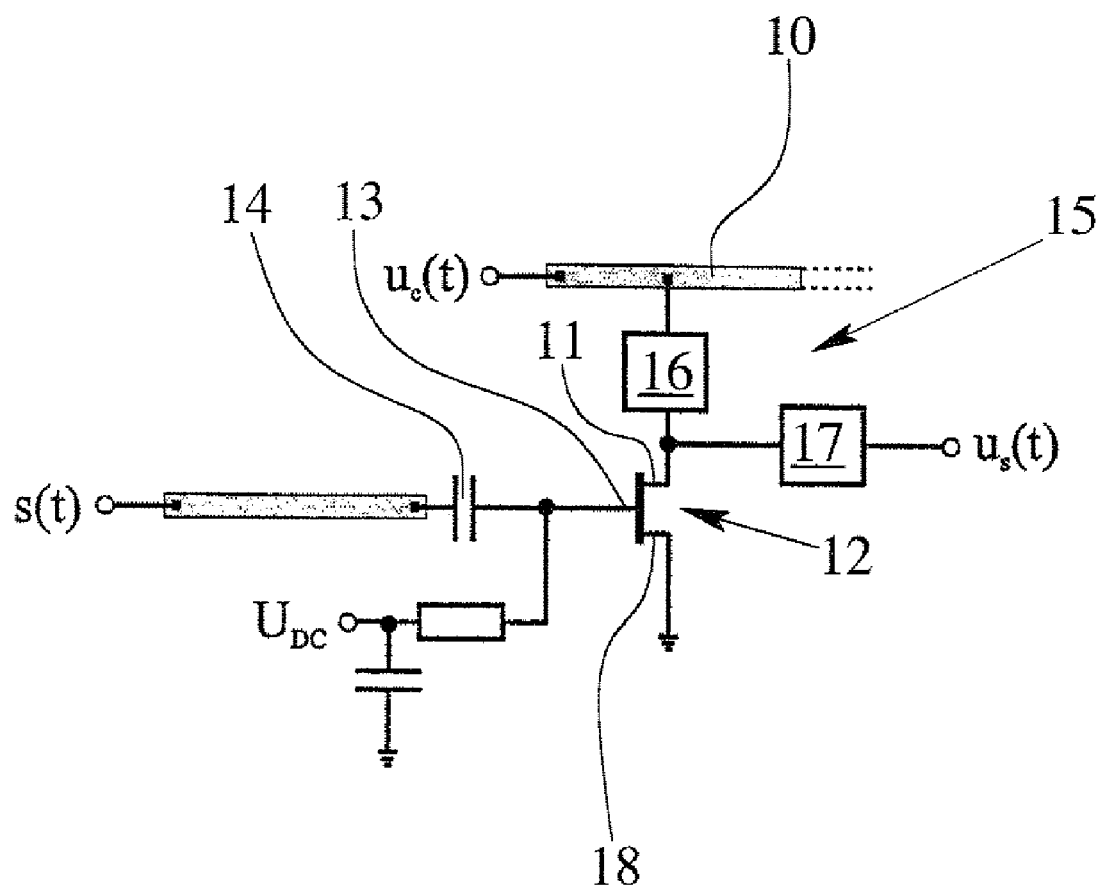
FIG. 2 is a block diagram of a first preferred exemplary embodiment of the present invention.

FIG. 1 shows a sampling circuit according to a first preferred embodiment of the invention. The input signal to be sampled is supplied to the sampling circuit via a transmitting and receiving line 10. The input signal to be sampled is injected via the drain contact 11 of a field effect transistor 12. The sampling signal s(t) is sent to the gate 13 of the field effect transistor 12. In combination with an applied DC bias $U_{DC}$, the sampling signal thus periodically controls the channel resistance of the drain-source section, with which the working point for the input signal $u_c(t)$ to be sampled is determined. The DC working point of the field effect transistor 12 is generally selected via the bias applied to the gate contact 13 such that, in combination with the sampling signal supplied via a capacitor 14, modulation of the channel between the closed and open channel takes place.

Furthermore, by choosing the DC bias and the polarity of the pulses of the sampling signal in combination with the channel doping of the field effect transistor 12, the impedance of the drain-source section which is average in time, and thus, the output impedance of the circuit can be determined. If the gate 13 of the field effect transistor 12 is, for example, negatively biased in the n-doped channel and the polarity of the sampling signal is selected to be positive, the drain-source section is low-resistance only during the interval of the short pulses of the sampling signal, and thus, is high-resistance averaged over time, here, in the range of several Kohms.

On the other hand, a slightly positive DC bias in combination with negative pulses of the sampling signal, averaged over time, causes relatively low-resistance impedance of the drain-source section in the range of a few ohms. The polarity selection of the triggering of the circuit and the associated determination of the output impedance does not directly affect the efficiency of the circuit, but depends rather on the intended application. An implementation with a low-resistance output impedance, for example, enables a roughly DC-free output signal in spite of the possibly required DC-coupled decoupling of the intermediate frequency signal, since, over the low-resistance channel resistor, a storage charge cannot build up which would then be superimposed on the intermediate frequency signal as the DC portion.

The input signal $u_c(t)$ to be sampled is fed and the sampled signal, therefore the output signal $U_s(t)$, is decoupled on the drain contact 11 of the field effect transistor 12. Here, the two signals are separated from one another by a filter arrangement 15. On the side of feed of the input signal, there is specifically a high-pass filter 16 and on the side of decoupling of the sampled signal there is a low-pass filter 17. Here, the use of a multistage LC filter which has only magnetically shielded inductances is recommended in order to suppress possible magnetic coupling at this circuit point.

Figure 3:
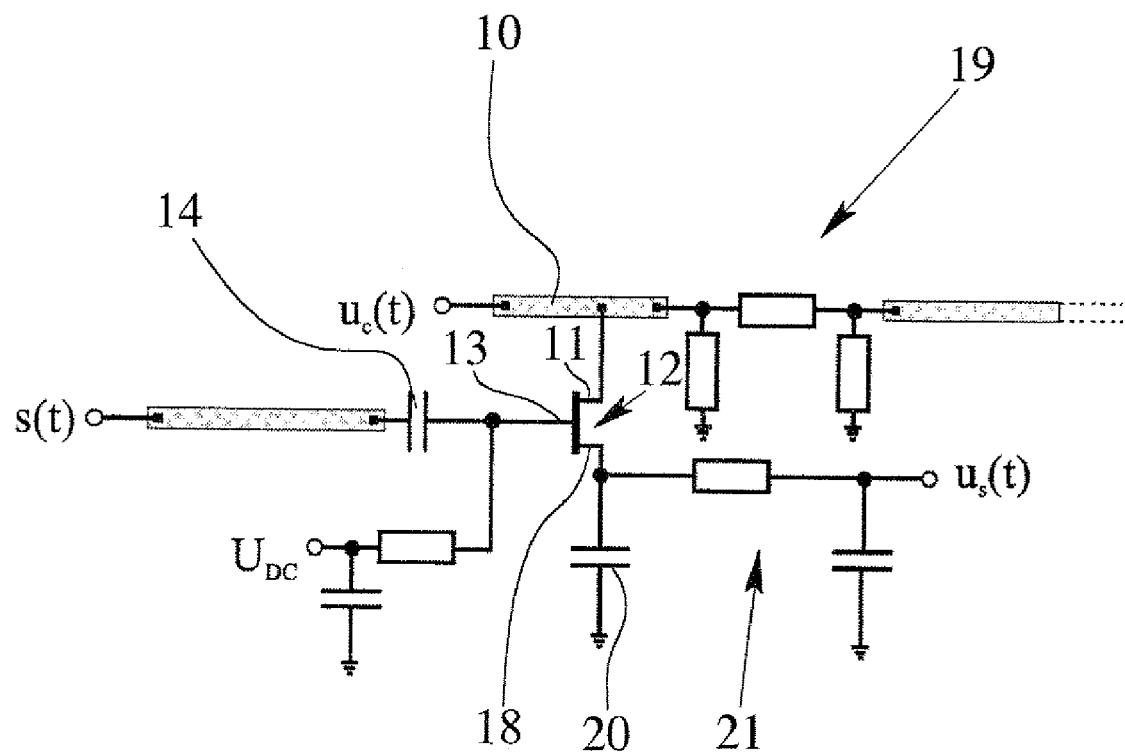
FIG. 3 is a block diagram of a second preferred exemplary embodiment of the present invention.

FIG. 3 shows a sampling circuit according to a second preferred exemplary embodiment of the invention. By a slight modification of the structure of the circuit as compared to the first preferred exemplary embodiment of the invention, the required filter While the drain contact 11 of the field effect transistor 12 without a filter is directly in the transmitting and receiving path, there is tapping of the output signal on the source contacts 18 of the field effect transistor 12. In this preferred embodiment of the invention, a II-attenuation element 19, which is used to improve the input matching of the circuit, is installed in the transmitting and receiving line.

If, as described above, the bias on the gate 13 of the field effect transistor 12 is selected to be negative and the polarity of the pulses of the sampling signal to be positive, for the duration of the pulse of the sampling signal, the channel resistance of the drain-source section becomes low-resistance, so that a storage capacitor 20 connected to the source contact 18 is charged to a fraction of the instantaneous voltage of $u_c(t)$. For the remaining time of the sampling period, the channel is high-resistance so that intermediate frequency tapping of the input signal $u_c(t)$ which is to be sampled is isolated. To further suppress the small higher frequency signal portions superimposed on the intermediate frequency signal on the source contact, a simple RC filter cascade 21 is used. In RC filters, it is advantageous that they are insensitive to incident magnetic and electrical radiation, in contrast to LC filters, so that injection of noncoherent signals is prevented.

Figure 4:
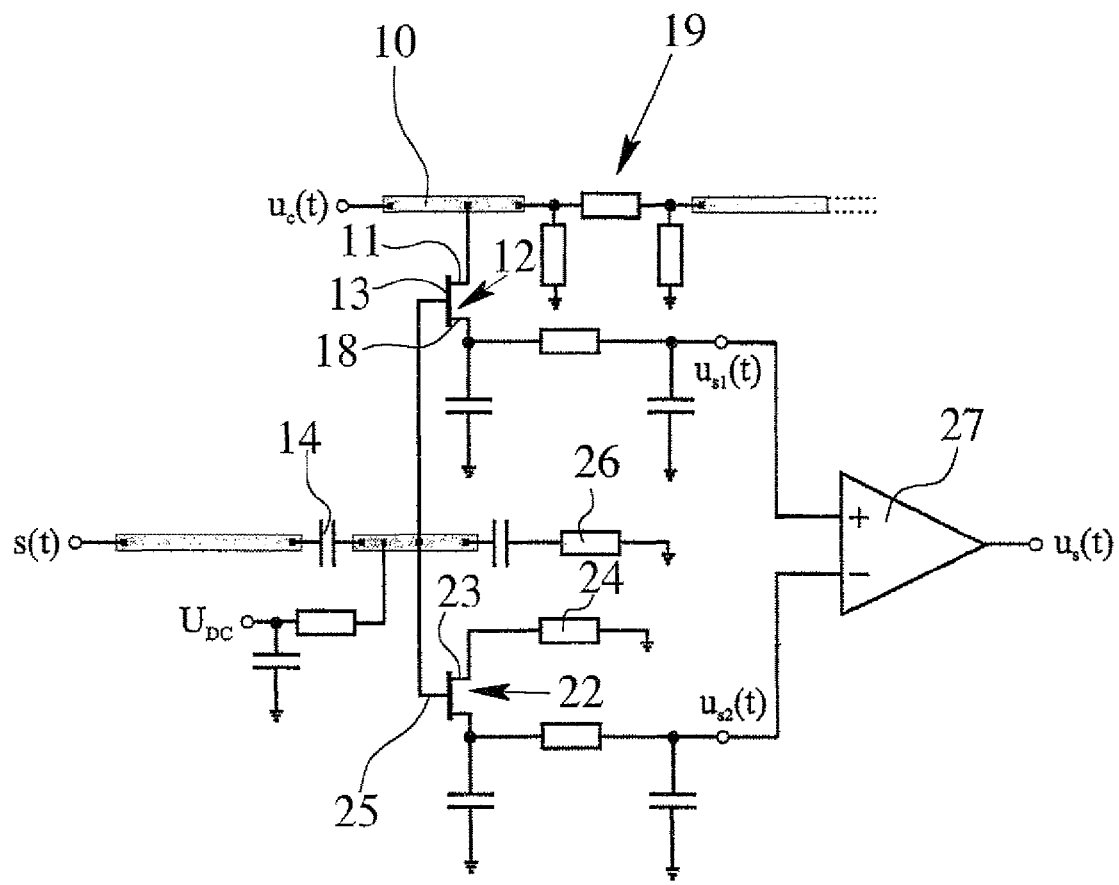
FIG. 4 is a block diagram of a third preferred exemplary embodiment of the present invention.

FIG. 4 describes a sampling circuit according to a third preferred exemplary embodiment of the invention. Here, it is more or less an expansion of the circuit shown in FIG. 3 according to the second preferred embodiment of the invention, there being an additional field effect transistor 22. This circuit with two field effect transistors 12, 22 is composed of two individual circuits of identical structure, the output signal of the entire circuit being formed from the difference of the intermediate frequency signals of the two individual circuits, for which there is a difference amplifier 27. The upper individual circuit of the entire circuit according to the third preferred exemplary embodiment of the invention from FIG. 4 corresponds to the above described circuit from FIG. 3. The field effect transistor 22 of the bottom circuit is, however, connected as a "dummy." This means that the drain contact 23 of the additional field effect transistor 22 is loaded with an impedance 24 which is identical to the load impedance by which the field effect transistor 12 is loaded on the drain contact by the signal path.

In addition to the identical load-side connection of the field effect transistors 12, 22, the two circuits are triggered with the same sampling signal and the same gate bias. Graphically represented, this means that the pulses of the sampling signal travel beyond the two gates 13, 25 of the field effect transistors 12, 22 and are terminated without reflection with a terminating impedance 26. Due to the identical connection and triggering of the two field effect transistors 12, 22, the direct components in the intermediate frequency signals $u_{s1}(t)$ and $u_{s2}(t)$ of each circuit are likewise identical so that the DC-free intermediate frequency signal $u_s(t)$ results from the difference $u_{s1}(t)-u_{s2}(t)$.

What is claimed is:

1. Sampling circuit for sequential sampling of a broadband periodic input signal, comprising:

a nonlinear component to which a pulsed-shaped sampling signal is supplied, by which sampling is activated so that an output signal is produced by the nonlinear component, wherein the nonlinear component is a field effect transistor, wherein the input signal is provided at a drain contact of the field effect transistor, wherein the sampling signal is provided at a gate contact of the field effect transistor, wherein the output signal is output from the drain contact of the field effect transistor, and wherein the sampling circuit further comprises a filter arrangement provided between the input signal and the output signal, wherein the filter arrangement comprises a high-pass filter provided after the input signal and a low-pass filter provided before the output signal.

2. Sampling circuit as claimed in claim 1, wherein the low-pass filter or the high-pass filter comprises a multistage LC filter with magnetically shielded inductances.

* * * * *